United States Patent
Ko et al.

(10) Patent No.: US 11,910,641 B2
(45) Date of Patent: Feb. 20, 2024

(54) ELECTROLUMINESCENT DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Youngyik Ko, Beijing (CN); Weiyun Huang, Beijing (CN); Chao Zeng, Beijing (CN); Yizhen Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 463 days.

(21) Appl. No.: 17/309,474

(22) PCT Filed: Aug. 14, 2020

(86) PCT No.: PCT/CN2020/109286
§ 371 (c)(1),
(2) Date: May 28, 2021

(87) PCT Pub. No.: WO2021/077873
PCT Pub. Date: Apr. 29, 2021

(65) Prior Publication Data
US 2022/0029137 A1    Jan. 27, 2022

(30) Foreign Application Priority Data
Oct. 22, 2019 (CN) .......................... 201911009276.5

(51) Int. Cl.
*H01L 51/50* (2006.01)
*H10K 50/86* (2023.01)
(Continued)

(52) U.S. Cl.
CPC ........... *H10K 50/86* (2023.02); *G06F 3/0412* (2013.01); *G06F 3/0445* (2019.05); *H10K 59/40* (2023.02);
(Continued)

(58) Field of Classification Search
CPC ....... H10K 50/86; H10K 59/40; G06F 3/0445
See application file for complete search history.

(56) References Cited

U.S. PATENT DOCUMENTS

2015/0115297 A1    4/2015  Lee
2015/0187857 A1    7/2015  Negishi et al.
(Continued)

FOREIGN PATENT DOCUMENTS

CN    108919545 A    11/2018
CN    109120753 A    1/2019
(Continued)

OTHER PUBLICATIONS

First Chinese Office Action dated Jul. 23, 2021, received for corresponding Chinese application No. 201911009276.5, 19 pages.

*Primary Examiner* — Anthony Ho
(74) *Attorney, Agent, or Firm* — Kinney & Lange, P.A.

(57) ABSTRACT

An electroluminescent display substrate and a display device are provided. The electroluminescent display substrate includes: a base substrate; a display light-emitting element arranged on the base substrate; an encapsulation structure arranged on the base substrate and covering the display light-emitting element; a light-shielding structure arranged on a side of the encapsulation structure away from the base substrate; and an opening at least passing through the
(Continued)

encapsulation structure. The light-shielding structure includes a first light-shielding portion and a second light-shielding portion that extend continuously. A vertical distance between the first light-shielding portion and the base substrate is greater than that between the light-emitting layer of the display light-emitting element and the base substrate, and a vertical distance between at least a part of the second light-shielding portion and the base substrate is less than that between the light-emitting layer of the display light-emitting element and the base substrate.

19 Claims, 8 Drawing Sheets

(51) Int. Cl.
*G06F 3/044* (2006.01)
*G06F 3/041* (2006.01)
*H10K 59/40* (2023.01)
*H10K 71/00* (2023.01)
*H10K 50/844* (2023.01)
*H10K 59/12* (2023.01)
*H10K 77/10* (2023.01)

(52) U.S. Cl.
CPC ........... *H10K 71/00* (2023.02); *H10K 50/844* (2023.02); *H10K 59/1201* (2023.02); *H10K 77/10* (2023.02)

(56) References Cited

U.S. PATENT DOCUMENTS

| | | |
|---|---|---|
| 2018/0069198 A1 | 3/2018 | Wang et al. |
| 2021/0011571 A1 | 1/2021 | Zhang et al. |
| 2021/0013285 A1 | 1/2021 | Hsieh |
| 2021/0202596 A1 | 7/2021 | Wang |
| 2021/0273194 A1 | 9/2021 | Xie et al. |

FOREIGN PATENT DOCUMENTS

| | | |
|---|---|---|
| CN | 110112150 A | 8/2019 |
| CN | 110212113 A | 9/2019 |
| CN | 110265470 A | 9/2019 |
| CN | 110289301 A | 9/2019 |
| CN | 110349976 A | 10/2019 |
| CN | 110729334 A | 1/2020 |

ELECTROLUMINESCENT DISPLAY
SUBSTRATE AND DISPLAY DEVICE

CROSS REFERENCE TO RELATED
APPLICATION(S)

This application is a Section 371 National Stage Application of International Application No. PCT/CN2020/109286, filed on Aug. 14, 2020, entitled "ELECTROLUMINESCENT DISPLAY SUBSTRATE AND DISPLAY DEVICE", which in turn claims priority to Chinese Patent Application No. 201911009276.5, filed on Oct. 22, 2019, the contents of which are incorporated herein by reference in their entireties.

TECHNICAL FIELD

The present disclosure relates to a field of display technology, and in particular to an electroluminescent display substrate and a display device.

BACKGROUND

With advancement of science and technology, in recent years, a special-shaped screen and a full screen have gradually come into the public view. The special-shaped screen and the full screen are both to increase a screen-to-body ratio of a display device. In order to achieve a higher screen-to-body ratio, openings need to be reserved for some additional components (such as cameras, sensors, etc.) at some positions of the display screen.

SUMMARY

In a first aspect, there is provided an electroluminescent display substrate, including: a base substrate; a display light-emitting element arranged on the base substrate, wherein the display light-emitting element includes a light-emitting layer for emitting light; an encapsulation structure arranged on the base substrate and covering the display light-emitting element; a light-shielding structure arranged on a side of the encapsulation structure away from the base substrate; and an opening at least passing through the encapsulation structure, wherein an orthographic projection of the light-shielding structure on the base substrate is located between an orthographic projection of the light-emitting layer of the display light-emitting element on the base substrate and an orthographic projection of the opening on the base substrate, the light-shielding structure includes a first light-shielding portion and a second light-shielding portion that extend continuously, the base substrate includes a first surface close to the display light-emitting element and the light-shielding structure, a vertical distance between the first light-shielding portion and the first surface of the base substrate is greater than a vertical distance between the light-emitting layer of the display light-emitting element and the first surface of the base substrate, and a vertical distance between at least a part of the second light-shielding portion and the first surface of the base substrate is less than the vertical distance between the light-emitting layer of the display light-emitting element and the first surface of the base substrate.

In some embodiments, the light-emitting layer of the display light-emitting element includes a first surface close to the base substrate, and the vertical distance between at least a part of the second light-shielding portion and the first surface of the base substrate is less than a vertical distance between the first surface of the light-emitting layer and the first surface of the base substrate.

In some embodiments, the electroluminescent display substrate further includes a touch structure arranged on a side of the encapsulation structure away from the base substrate, and the touch structure includes: a first touch layer arranged on a side of the encapsulation structure away from the base substrate, wherein the first touch layer includes a first touch structure close to the opening, and the first touch structure forms the light-shielding structure; and a second touch layer arranged on a side of the first touch layer away from the base substrate.

In some embodiments, the electroluminescent display substrate further includes a touch structure arranged on a side of the encapsulation structure away from the base substrate, and the touch structure includes: a first touch layer arranged on a side of the encapsulation structure away from the base substrate; and a second touch layer arranged on a side of the first touch layer away from the base substrate, wherein the second touch layer includes a second touch structure close to the opening, and the second touch structure forms the light-shielding structure.

In some embodiments, the first touch layer includes a plurality of first touch wires arranged in a same layer, and the first touch structure is one of the plurality of first touch wires that is close to the opening.

In some embodiments, the second touch layer includes a plurality of second touch wires arranged in a same layer, and the first touch structure has a width greater than a width of each of the plurality of the second touch wires.

In some embodiments, the first touch layer includes a plurality of first touch wires arranged in a same layer, and the first touch structure is a first dummy touch wire arranged in a same layer as the plurality of first touch wires and arranged close to the opening.

In some embodiments, the second touch layer includes a plurality of second touch wires arranged in a same layer, and the first dummy touch wire has a width greater than a width of each of the plurality of the second touch wires.

In some embodiments, the second touch layer includes a plurality of second touch wires arranged in a same layer, and the second touch structure is one of the plurality of second touch wires that is close to the opening.

In some embodiments, the first touch layer includes a plurality of first touch wires arranged in a same layer, and the second touch structure has a width greater than a width of each of the plurality of the first touch wires.

In some embodiments, the second touch layer includes a plurality of second touch wires arranged in a same layer, and the second touch structure is a second dummy touch wire arranged in a same layer as the plurality of second touch wires and arranged close to the opening.

In some embodiments, the first touch layer includes a plurality of first touch wires arranged in a same layer, and the second dummy touch structure has a width greater than a width of each of the plurality of the first touch wires.

In some embodiments, the touch structure further includes a touch insulating layer arranged on a side of the first touch layer away from the base substrate, and the touch insulating layer covers the first touch structure.

In some embodiments, the touch structure further includes a touch cover layer arranged on a side of the second touch layer away from the base substrate, and the touch cover layer covers the second touch structure.

In some embodiments, the encapsulation structure further includes: a first inorganic encapsulation layer arranged on a side of the display light-emitting element away from the base substrate; an organic encapsulation layer arranged on a side of the first inorganic encapsulation layer away from the base substrate; and a second inorganic encapsulation layer arranged on a side of the organic encapsulation layer away from the base substrate, wherein an orthographic projection of the organic encapsulation layer on the base substrate has an area less than an area of an orthographic projection of each of the first inorganic encapsulation layer and the second inorganic encapsulation layer on the base substrate, an orthographic projection of the first light-shielding portion on the base substrate overlaps the orthographic projection of the organic encapsulation layer on the base substrate, and an orthographic projection of the second light-shielding portion on the base substrate does not overlap the orthographic projection of the organic encapsulation layer on the base substrate.

In some embodiments, the electroluminescent display substrate further includes an isolation structure arranged on the base substrate, an orthographic projection of the isolation structure on the base substrate is located between the orthographic projection of the light-emitting layer of the display light-emitting element on the base substrate and the orthographic projection of the opening on the base substrate, and the orthographic projection of the light-shielding structure on the base substrate overlaps the orthographic projection of the isolation structure on the base substrate.

In some embodiments, the orthographic projection of the second light-shielding portion on the base substrate at least partially overlaps the orthographic projection of the isolation structure on the base substrate.

In some embodiments, the electroluminescent display substrate further includes a barrier layer arranged between the encapsulation structure and the touch structure, and the light-shielding structure is located on a surface of the barrier layer away from the base substrate.

In a second aspect, there is provided a display device including the electroluminescent display substrate described above.

BRIEF DESCRIPTION OF THE DRAWINGS

In order to more clearly explain the technical solutions in the exemplary embodiments of the present disclosure, the drawings of the embodiments will be briefly introduced below. It should be noted that the drawings in the following description are only some exemplary embodiments of the present disclosure, and are not intended to limit the present disclosure.

Figure 1:
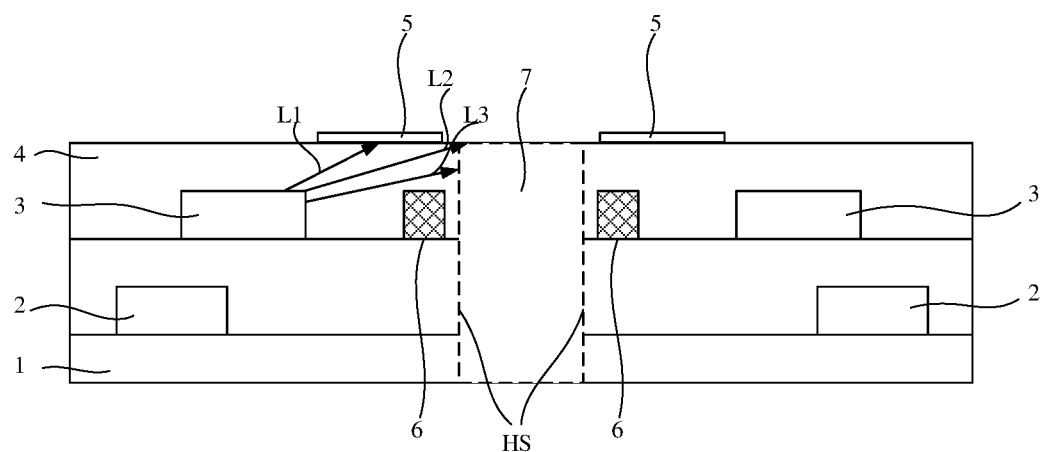
FIG. 1 shows a schematic cross-sectional view of a portion of an electroluminescent display substrate around an opening in the related art.

It should be noted that for the sake of clarity, in the drawings used to describe the embodiments of the present disclosure, sizes of layers, structures or areas may be enlarged or reduced, that is, these drawings are not drawn according to actual scale.

DETAILED DESCRIPTION OF EMBODIMENTS

The technical solutions of the present disclosure will be further described in detail below through the embodiments in conjunction with the drawings. In the specification, the same or similar reference signs indicate the same or similar components. The following description of the embodiments of the present disclosure with reference to the drawings is intended to explain the general inventive concept of the present disclosure, and should not be understood as a limitation of the present disclosure.

In addition, in the following detailed description, for ease of interpretation, many specific details are set forth to provide a comprehensive understanding of the embodiments of the present disclosure. Obviously, however, one or more embodiments may also be implemented without these specific details.

It should be noted that "on", "formed on" and "arranged on" mentioned herein may mean that a layer is directly formed or arranged on another layer, or mean that a layer is indirectly formed or arranged on another layer, that is, there are other layers between the two layers.

It should be noted that although the terms "first", "second", and so on used herein may describe various components, members, elements, regions, layers and/or parts, these components, members, elements, regions, layers and/or parts should not be limited by these terms. Rather, these terms are used to distinguish a component, a member, an element, a region, a layer and/or a part from another component, member, element, region, layer and/or part. Thus, for example, a first component, a first member, a first element, a first region, a first layer and/or a first part discussed below may be referred to as a second component, a second member, a second element, a second region, a second layer and/or a second part without departing from the teachings of the present disclosure.

In the present disclosure, unless otherwise specified, the term "arranged in a same layer" used means that two layers, components, members, elements or parts may be formed by a same patterning process, and the two layers, components, members, elements or parts are generally formed of a same material.

In the present disclosure, unless otherwise specified, the expression "patterning process" generally includes steps of photoresist coating, exposure, development, etching, and photoresist stripping. The expression "one-time patterning process" means a process of forming patterned layers, components, elements and so on by using one mask.

In the present disclosure, unless otherwise specified, the expression "touch wire" refers to a wire that is electrically connected to a touch electrode and is used to transmit a touch signal, and the expression "dummy touch wire" refers to a wire that is arranged in a same layer as the touch wire used to transmit the touch signal, and the dummy touch wire is not used to transmit an actual touch signal.

Herein, unless otherwise specified, the expression "extend continuously" means that two portions extend continuously without interruption, that is, the two portions form a whole structure.

FIG. 1 shows a schematic cross-sectional view of a portion of an electroluminescent display substrate around an opening in the related art. As shown in FIG. 1, the display substrate may include: a base substrate 1, and a thin film transistor (TFT) 2, a display light-emitting element 3, an encapsulation structure 4 and a light-shielding structure 5 sequentially arranged on the base substrate 1. For example, an opening 7 may pass through the base substrate 1 and each film layer on the base substrate 1 in a direction perpendicular to the base substrate 1. The display substrate may further include an isolation column 6 between the opening 7 and the display light-emitting element 3 so as to prevent water vapor and oxygen from entering the display light-emitting element 3 through a side surface (for example, a side surface HS indicated in FIG. 1) of the opening 7.

For example, the display light-emitting element 3 may include an OLED device, that is, the display light-emitting element 3 may include an anode, a cathode, and an organic light-emitting layer arranged between the anode and the cathode.

For example, the light-shielding structure 5 may be made of an opaque metal material.

Light rays emitted from the organic light-emitting layer of the display light-emitting element 3 may exit from the opening 7, so that human eyes may observe a phenomenon of light leakage at an edge of the opening. In order to alleviate the light leakage, a common practice in the related art is to increase a coverage area of the light-shielding structure 5. As shown in FIG. 1, a width of the light-shielding structure 5 is increased so that the light-shielding structure 5 extends toward the side surface HS of the opening 7. In this way, a part of the light rays (for example, a light ray L1 in FIG. 1) emitted from the organic light-emitting layer and directed toward the opening 7 may be shielded by the light-shielding structure 5 so as to prevent the light rays from exiting from the opening 7. However, as shown in FIG. 1, another part of the light rays (for example, light rays L2 and L3 in FIG. 1) emitted from the organic light-emitting layer and directed toward the opening 7 is not shielded by the light-shielding structure 5 and may still exit from the opening 7, so that human eyes may still observe the phenomenon of the light leakage at the edge of the opening 7.

Figure 2:
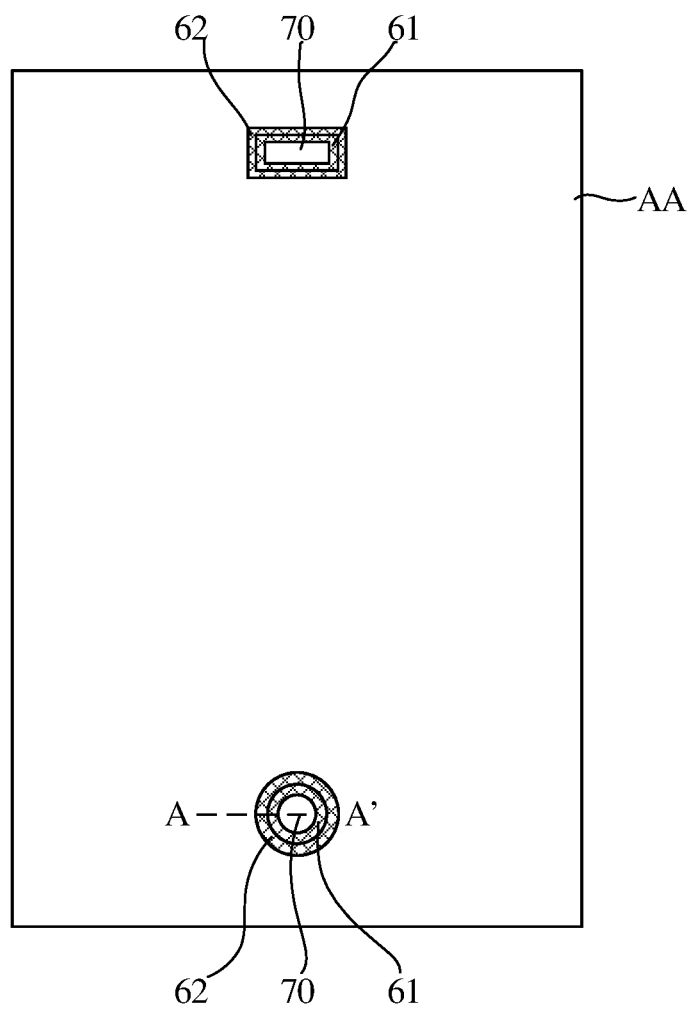
FIG. 2 shows a plan view of an electroluminescent display substrate according to an exemplary embodiment of the present disclosure.
Figure 3:
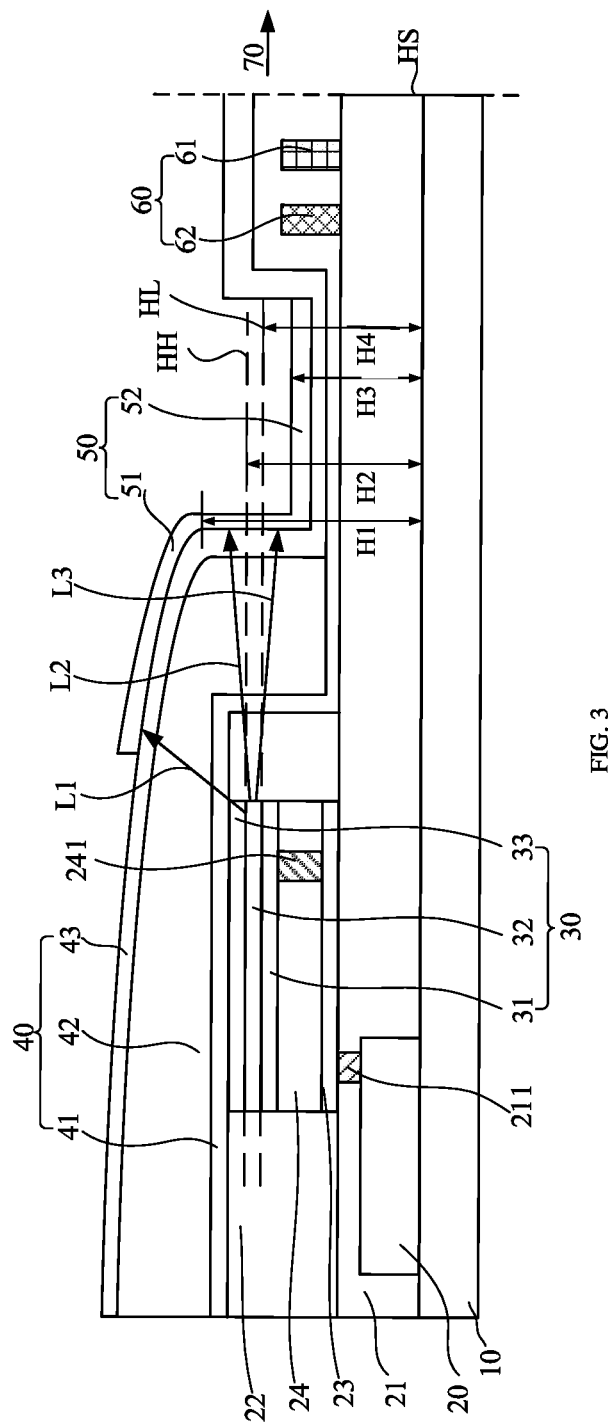
FIG. 3 shows a schematic cross-sectional view of the electroluminescent display substrate according to an exemplary embodiment of the present disclosure, taken along line A-A' in FIG. 2.

FIG. 2 shows a plan view of an electroluminescent display substrate according to an exemplary embodiment of the present disclosure. FIG. 3 shows a schematic cross-sectional view of the electroluminescent display substrate according to an exemplary embodiment of the present disclosure, taken along line A-A' in FIG. 2. As shown in FIG. 2, the electroluminescent display substrate includes a display area AA and at least one opening 70 located in the display area AA. In FIG. 2, two openings 70 are illustrated by way of example. It should be understood that the embodiments of the present disclosure are not limited thereto. In other embodiments, less (for example, one) or more openings 70 may be provided.

It should be noted that the "opening" mentioned in the present disclosure refers to an area on the display substrate for installing a hardware structure, which is called an opening in the present disclosure for the convenience of description. The opening includes but is not limited to the forms of a through hole, a groove, an aperture, etc. In some embodiments, the hardware structure may include one or more of the structures of a front camera, a HOME key, an earpiece or a speaker. The specific installation manner of the hardware structure is not particularly limited in the embodiments of the present disclosure. In addition, a shape of the opening may be determined according to a shape of the hardware structure to be installed. For example, a cross section of the opening in a direction parallel to the base substrate of the display substrate may have one or more of the shapes of a circle, an oval, a rectangle, a rounded rectangle, a square, a diamond, a trapezoid, etc.

As shown in FIG. 3, the electroluminescent display substrate, such as an OLED display substrate, may include: a base substrate 10, and a thin film transistor (TFT) 20, a display light-emitting element 30, an encapsulation structure 40 and a light-shielding structure 50 sequentially arranged on the base substrate 10. For example, an opening 70 may pass through the base substrate 10 and each film layer on the base substrate 10 in a direction perpendicular to the base substrate 10. The embodiments of the present disclosure are not limited thereto, and the opening 70 may also be provided as desired to pass through the film layers except for the base substrate 10 in a thickness direction of the base substrate 10. A portion that the opening 70 passes through may be set as desired, which is not limited herein. In addition, the electroluminescent display substrate may further include an insulating layer 21, a pixel defining layer 22, a conductive layer 23, an insulating layer 24 and other film layers, and these film layers may refer to film layers in the related art, and will not be repeated here.

Continuing to refer to FIG. 3, the display substrate may further include an isolation structure 60 located between the opening 70 and the display light-emitting element 30 so as to prevent water vapor and oxygen from entering the display light-emitting element 30 through the side surface (for example, the side surface HS indicated in FIG. 3) of the opening 70. In the plan view shown in FIG. 2, the opening 70 includes a closed ring pattern, and the isolation structure 60 is arranged around the opening 70. Therefore, the isolation structure 60 also includes a closed ring pattern. Also, from the plan view, a shape of the isolation structure 60 is consistent with a shape of the opening 70. For example, a lower opening 70 in FIG. 2 is circular, and the corresponding isolation structure 60 is also circular, while an upper opening 70 is rectangular, and the corresponding isolation structure 60 is also rectangular.

For example, the display light-emitting element 30 may include an OLED device, that is, the display light-emitting element 30 may include an anode 31, a cathode 33, and an organic light-emitting layer 32 arranged between the anode 31 and the cathode 33. For example, the conductive layer 23 may be electrically connected to a source electrode or a drain electrode of the thin film transistor 20 through a via hole 211 formed in the insulating layer 21, and the anode 31 may be electrically connected to the conductive layer 23 through a via hole 241 formed in the insulating layer 24, thereby achieving an electrical connection with the source electrode or the drain electrode of the thin film transistor 20.

For example, the encapsulation structure 40 may include film layers formed alternately by inorganic layers and organic layers. For example, the encapsulation structure 40 may include a first inorganic encapsulation layer 41, an organic encapsulation layer 42 and a second inorganic encapsulation layer 43 arranged sequentially. The organic encapsulation layer 42 is located between the first inorganic encapsulation layer 41 and the second inorganic encapsulation layer 43. The first inorganic encapsulation layer 41, the organic encapsulation layer 42 and the second inorganic encapsulation layer 43 all cover the display light-emitting element 30 so as to protect the display light-emitting element 30 from water vapor and oxygen. As shown in FIG. 3, the first inorganic encapsulation layer 41 is formed on a side of the display light-emitting element 30 away from the base substrate 10, the organic encapsulation layer 42 is formed on a side of the first inorganic encapsulation layer 41 away from the base substrate 10, and the second inorganic encapsulation layer 43 is formed on a side of the organic encapsulation layer 42 away from the base substrate 10.

As shown in FIG. 3, the isolation structure 60 may include a first isolation column 61 and a second isolation column 62, that is, more than two isolation columns are provided on a side of the opening 70 so as to better prevent water vapor and oxygen from entering the display light-emitting element through the side surface of the opening 70. For example, the first isolation column 61 and the second isolation column 62 are both arranged between the opening 70 and the display light-emitting element 30, and the first isolation column 61 is closer to the opening 70 than the second isolation column 62.

For example, as shown in FIG. 3, the first inorganic encapsulation layer 41 and the second inorganic encapsulation layer 43 not only cover the display light-emitting element 30, but also cover the first isolation column 61 and the second isolation column 62. The first inorganic encapsulation layer 41 and the second inorganic encapsulation layer 43 extend to the side surface HS of the opening 70. The organic encapsulation layer 42 covers the display light-emitting element 30, but does not cover the first isolation column 61 and the second isolation column 62, that is, the organic encapsulation layer 42 extends to an inner side of the second isolation column 62 (that is, a side of the second isolation column 62 away from the opening 70). With this arrangement, water vapor and oxygen may be prevented from entering the display light-emitting element 30 through the side surface HS of the opening 70.

For example, an orthographic projection of the organic encapsulation layer 42 on the base substrate 10 has an area less than that of an orthographic projection of each of the first inorganic encapsulation layer 41 and the second inorganic encapsulation layer 43 on the base substrate 10. As shown in FIG. 3, a thickness of the organic encapsulation layer 42 may decrease as it extends toward the opening 70. In this way, a height of an upper surface of the organic encapsulation layer 42 gradually decreases in a direction toward the opening 70. In practice, when the organic encapsulation layer 42 is formed, an amount of an organic material layer is increased, so that the organic encapsulation layer 42 having a sufficient thickness may be formed on an edge of the display area. However, in this case, a quantity of reflux of the organic material increases. Then, the organic encapsulation layer 42 may be formed all the way to an outer side of the first isolation column 61 and the second isolation column 62, and therefore, a probability that the organic encapsulation layer 42 is exposed on the side surface HS of the opening 70 increases. As a result, water vapor and oxygen may permeate through the exposed organic encapsulation layer 42 and enter the display light-emitting element 30, thereby reducing a reliability of the display device.

Therefore, in order not to extend the organic encapsulation layer 42 to the outer side of the first isolation column 61 and the second isolation column 62, the amount of the organic material layer may not be increased so as to reduce the thickness of the organic encapsulation layer 42 on the edge of the display area. Therefore, the upper surface of the organic encapsulation layer 42 has a large thickness above the display light-emitting element 30 so as to cover the display light-emitting element 30 well, while in a transition area between the display light-emitting element 30 and the isolation structure 60, the height of the upper surface of the organic encapsulation layer 42 gradually decreases, and the organic encapsulation layer 42 is not provided on the outer side of the second isolation column 62 so as to avoid the exposure of the organic encapsulation layer 42 on the side surface HS of the opening 70.

As shown in FIG. 3, the first inorganic encapsulation layer 41 and the second inorganic encapsulation layer 43 extend to the side surface HS of the opening 70, and the organic encapsulation layer 42 extends to the inner side of the second isolation column 62. In this way, the encapsulation structure 40 has a height difference in proximity to the isolation structure 60, and the surface of the second inorganic encapsulation layer 43 away from the base substrate 10 has a height difference in proximity to the isolation structure 60.

Continuing to refer to FIG. 3, an orthographic projection of the light-shielding structure 50 on the base substrate 10 is located between an orthographic projection of the organic light-emitting layer 32 of the display light-emitting element 30 on the base substrate 10 and an orthographic projection of the opening 70 on the base substrate 10. The light-shielding structure 50 is arranged on the encapsulation structure 40, that is, on a surface of the encapsulation structure 40 away from the base substrate 10. The light-shielding structure 50 may be arranged on a surface of the second inorganic encapsulation layer 43 away from the base substrate 10, which surface has a height difference in proximity to the isolation structure 60. In this way, when the light-shielding structure 50 extends on the surface of the second inorganic encapsulation layer 43 away from the base substrate 10, it may extend from a position higher than the display light-emitting element 30 to a position lower than the display light-emitting element 30. The light-emitting layer 32 of the display light-emitting element 30 includes a first surface (that is, a lower surface shown) close to the base substrate 10 and a second surface (that is, an upper surface shown) away from the base substrate 10. As shown in FIG. 3, a height position of the first surface of the light-emitting layer 32 is indicated by a dotted line HL, and a height position of the second surface of the light-emitting layer 32 is indicated by a dotted line HH. In the embodiment shown in FIG. 3, when the light-shielding structure 50 extends on the surface of the second inorganic encapsulation layer 43 away from the base substrate 10, it extends from a position higher than the light-emitting layer 32 to a position lower than the light-emitting layer 32. For example, a portion of the light-shielding structure 50 is located higher than the dotted line HH, and the other portion of the light-shielding structure 50 is located lower than the dotted line HH.

As shown in FIG. 3, the light-shielding structure 50 may include a first light-shielding portion 51 and a second light-shielding portion 52 that extend continuously. An orthographic projection of the first light-shielding portion 51 on the base substrate 10 overlaps the orthographic projection of the organic encapsulation layer 42 on the base substrate 10. An orthographic projection of the second light-shielding portion 52 on the base substrate 10 does not overlap the orthographic projection of the organic encapsulation layer 42 on the base substrate 10, but falls within the orthographic projection of each of the first inorganic encapsulation layer 41 and the second inorganic encapsulation layer 43 on the base substrate 10, and is located between the orthographic projection of the organic encapsulation layer 42 on the base substrate 10 and the orthographic projection of the opening 70 on the base substrate 10. Thus, as shown in FIG. 3, the first light-shielding portion 51 is located higher than the organic light-emitting layer 32 of the display light-emitting element 30, and the second light-shielding portion 52 is located lower than the organic light-emitting layer 32 of the display light-emitting element 30. For example, at least a part of the second light-shielding portion 52 is located lower than the first surface of the organic light-emitting layer 32. In other words, a vertical distance between the first light-shielding portion 51 and the base substrate 10 is greater than that between the display light-emitting element 30 and the base substrate 10, and a vertical distance between the second light-shielding portion 52 and the base substrate 10 is less than the vertical distance between the display light-emitting element 30 and the base substrate 10.

As shown in FIG. 3, the base substrate 10 includes a first surface (hereinafter also referred to as "an upper surface") close to the display light-emitting element 30 and the light-shielding structure 50.

For example, a vertical distance between the first light-shielding portion 51 and an upper surface of the base substrate 10 is greater than a vertical distance between the organic light-emitting layer 32 of the display light-emitting element 30 and the upper surface of the base substrate 10. The vertical distance between the first light-shielding portion 51 and the upper surface of the base substrate 10 may be determined by an average value of a plurality of vertical distances between the whole first light-shielding portion 51 and the upper surface of the base substrate 10. For example, the average value may be indicated by a vertical distance H1 shown in FIG. 3. The vertical distance between the organic light-emitting layer 32 of the display light-emitting element 30 and the upper surface of the base substrate 10 may be determined by a vertical distance between the second surface HH of the organic light-emitting layer 32 of the display light-emitting element 30 and the upper surface of the base substrate 10, which is indicated, for example, by a vertical distance H2 shown in FIG. 3.

A vertical distance between the second light-shielding portion 52 and the upper surface of the base substrate 10 is less than a vertical distance between the organic light-emitting layer 32 of the display light-emitting element 30 and the upper surface of the base substrate 10. The vertical distance between the second light-shielding portion 52 and the upper surface of the base substrate 10 may be determined by an average value of a plurality of vertical distances between the whole second light-shielding portion 52 and the upper surface of the base substrate 10. For example, the average value may be indicated by a vertical distance H3 shown in FIG. 3. The vertical distance between the organic light-emitting layer 32 of the display light-emitting element 30 and the upper surface of the base substrate 10 may be determined by the vertical distance H2 between the second surface HH of the organic light-emitting layer 32 of the display light-emitting element 30 and the upper surface of the base substrate 10.

For example, a vertical distance between at least a part of the second light-shielding portion 52 and the upper surface of the base substrate 10 is less than the vertical distance between the first surface (that is, the lower surface) of the organic light-emitting layer 32 and the upper surface of the base substrate 10. The at least a part of the second light-shielding portion 52 may include a part of the second light-shielding portion 52 lower than the position HL, and the vertical distance between the at least a part of the second light-shielding portion 52 and the upper surface of the base substrate 10 may be determined by an average value of a plurality of vertical distances between the part of the second light-shielding portions 52 lower than the position HL and the upper surface of the base substrate 10. For example, the vertical distance between the first surface (that is, the lower surface) of the organic light-emitting layer 32 and the upper surface of the base substrate 10 may be indicated by a vertical distance H4 shown in FIG. 3.

With such an arrangement, as shown in FIG. 3, the light rays emitted from the organic light-emitting layer 32 and directed toward the opening 70 (for example, the light rays L1, L2, L3 in FIG. 3) may be all shielded by the light-shielding structure 50 (including the first light-shielding portion 51 and the second light-shielding portion 52) and prevented from exiting from the opening 70. For example, the light rays L2 and L3 in FIG. 3 may be shielded by the second light-shielding portion 52 lower than the organic light-emitting layer 32 and prevented from exiting from the opening 70. In this way, the light leakage at the edge of the opening may be reduced or even avoided.

Figure 4:
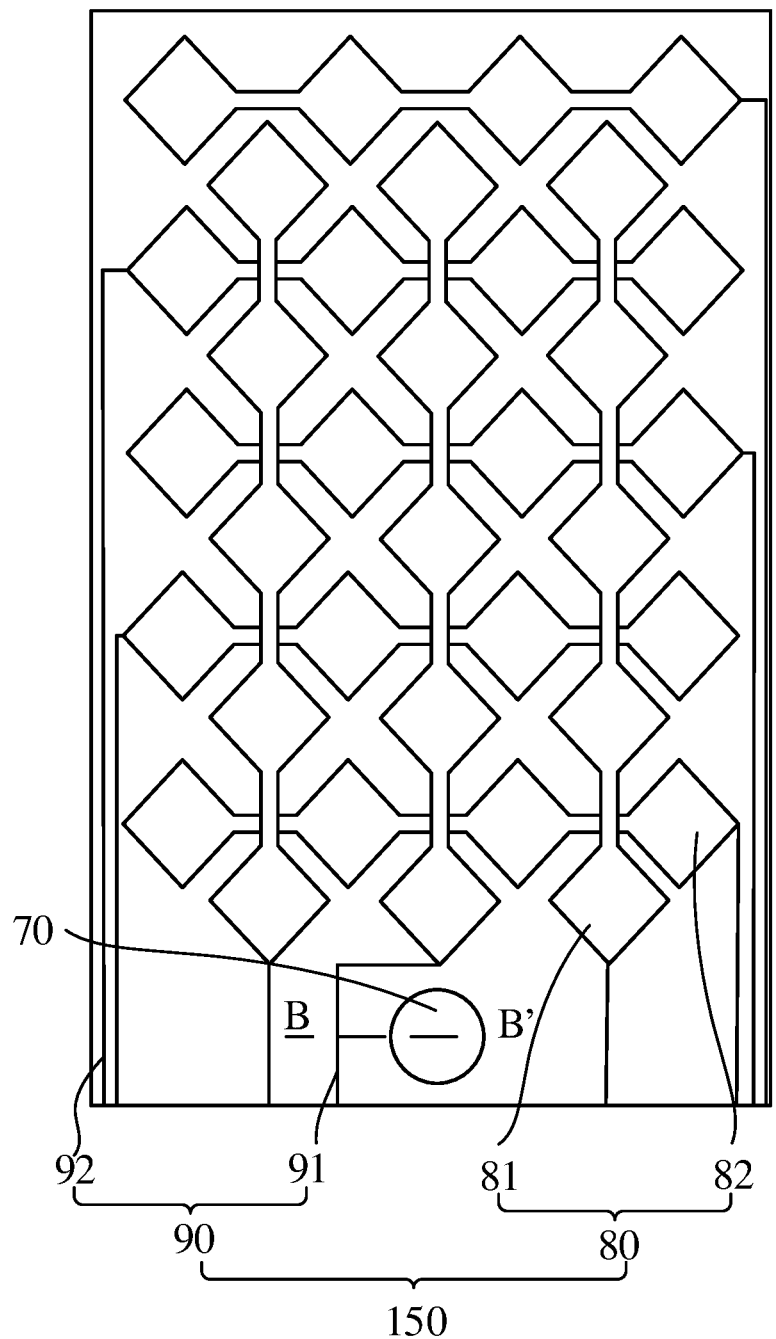
FIG. 4 shows a plan view of an electroluminescent display substrate according to an exemplary embodiment of the present disclosure, in which a touch structure of the electroluminescent display substrate according to the exemplary embodiment of the present disclosure is schematically shown.
Figure 5:
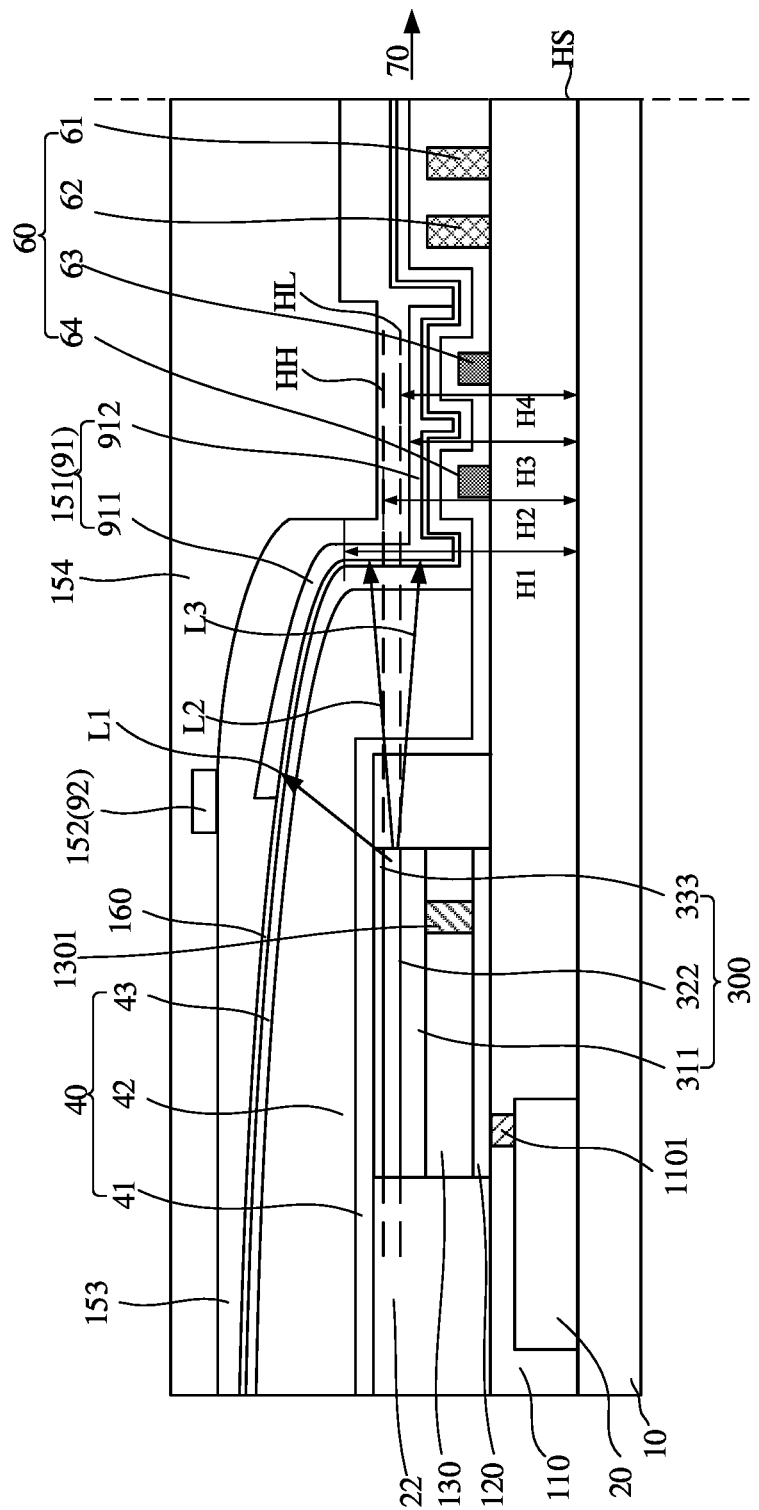
FIG. 5 shows a schematic cross-sectional view of the electroluminescent display substrate according to an exemplary embodiment of the present disclosure, taken along line B-B' in FIG. 4.

FIG. 4 shows a plan view of an electroluminescent display substrate according to an exemplary embodiment of the present disclosure, in which a touch structure of the electroluminescent display substrate according to the exemplary embodiment of the present disclosure is schematically shown. FIG. 5 shows a schematic cross-sectional view of the electroluminescent display substrate according to an exemplary embodiment of the present disclosure, taken along line B-B' in FIG. 4.

Referring to FIG. 4, the touch structure 150 may include a plurality of touch electrodes 80 and a plurality of touch wires 90 electrically connected to the plurality of touch electrodes 80. Exemplarily, the touch electrodes 80 may include first touch electrodes 81 and second touch electrodes 82. The first touch electrodes 81 and the second touch electrodes 82 may be alternately arranged so that they do not overlap each other in the display area. For example, the first touch electrodes 81 and the second touch electrodes 82 may be arranged in different layers. In other embodiments, the first touch electrodes 81 and the second touch electrodes 82 may be arranged in a same layer. For example, the first touch electrodes 81 may be one of a touch driving electrode and a touch sensing electrode, and the second touch electrodes 82 may be another of the touch driving electrode and the touch sensing electrode.

Continuing to refer to FIG. 4, the touch wires 90 may include first touch wires 91 and second touch wires 92. The first touch electrodes 81 may be electrically connected to the first touch wires 91, and the second touch electrodes 82 may be electrically connected to the second touch wires 92. For example, the first touch wires 91 and the first touch electrodes 81 may be provided in a same layer, and the second touch wires 92 and the second touch electrodes 82 may be provided in a same layer, but the embodiments of the present disclosure are not limited thereto.

For example, the first touch electrodes 81 and the second touch electrodes 82 may have a determined transmittance, so that the light emitted from the organic light-emitting layer 32 may be transmitted through the first touch electrodes 81 and the second touch electrodes 82. For example, the first touch electrodes 81 and the second touch electrodes 82 may be made of a thin metal layer such as indium tin oxide (ITO), indium zinc oxide (IZO) or silver nanowires, or a transparent conductive material such as metal grids or carbon nanotubes, but the embodiments of the present disclosure are not limited thereto.

For example, the first touch wires 91 and the second touch wires 92 may be made of a low-resistance metal material such as molybdenum (Mo), silver (Ag), titanium (Ti), copper (Cu), aluminum (Al), that is, they are made of an opaque conductive metal material.

Referring to FIG. 5, the electroluminescent display substrate may include a base substrate 10, and a thin film transistor 20, a first insulating layer 110, a conductive layer 120, a second insulating layer 130, a display light-emitting element 300, an encapsulation structure 40, a touch structure 150 and an isolation structure 60 arranged on the base substrate 10.

For example, the first insulating layer 110 may be at least one layer selected from an interlayer insulating layer, a gate insulating layer, a buffer layer and a barrier layer. For example, the first insulating layer 110 may be a single-layer or multi-layer structure comprising silicon oxide or silicon nitride.

The thin film transistor 20 is arranged on the base substrate 10, and it may include an active layer, a gate electrode, a source electrode and a drain electrode. The structure of the thin film transistor 20 may refer to the structure of an existing thin film transistor, which will not be repeated here.

The conductive layer 120 is arranged on a side of the first insulating layer 110 away from the base substrate 10. For example, the conductive layer 120 may be electrically connected to the source electrode or the drain electrode of the thin film transistor 20. As shown in FIG. 5, a via hole 1101 is formed in the first insulating layer 110, and the conductive layer 120 may be electrically connected to the source electrode or the drain electrode of the thin film transistor 20 through the via hole 1101. For another example, the source electrode or the drain electrode of the thin film transistor 20 may form the conductive layer 120. The embodiments of the present disclosure do not specifically limit this.

The second insulating layer 130 is arranged on a side of the conductive layer 120 away from the base substrate 10, and the second insulating layer 130 may also be a single-layer or multi-layer structure comprising silicon oxide or silicon nitride. As shown in FIG. 5, a via hole 1301 is formed in the second insulating layer 130.

The display light-emitting element 300 is arranged on a side of the second insulating layer 130 away from the base substrate 10. The display light-emitting element 300 may include a first electrode 311, a second electrode 333, and an organic light-emitting layer 322 arranged between the first electrode and the second electrode. As shown in FIG. 5, a via hole 1301 may be formed in the second insulating layer 130, and the first electrode 311 is electrically connected to the conductive layer 120 through the via hole 1301. For example, the first electrode 311 may be one of the anode and the cathode, and the second electrode 333 may be another of the anode and the cathode. The first electrode 311 may be electrically connected to the conductive layer 120 via the via hole 1301 so as to achieve the electrical connection with the source electrode or the drain electrode of the thin film transistor 20.

The encapsulation structure 40 may include film layers formed alternately by inorganic layers and organic layers. For example, the encapsulation structure 40 may include a first inorganic encapsulation layer 41, an organic encapsulation layer 42 and a second inorganic encapsulation layer 43 arranged sequentially. The encapsulation structure 40 may refer to the above detailed description, which will not be repeated here.

The electroluminescent display substrate further includes a touch structure 150 arranged on a side of the encapsulation structure 40 away from the base substrate 10. Referring to FIG. 4 and FIG. 5, the touch structure 150 may include a first touch layer 151, a touch insulating layer 153, a second touch layer 152 and a touch cover layer 154. The first touch layer 151 may include a plurality of first touch wires 91 arranged in a same layer, and the second touch layer 152 may include a plurality of second touch wires 92 arranged in a same layer.

As shown in FIG. 5, the electroluminescent display substrate may further include a barrier layer 160 provided between the encapsulation structure 40 and the touch structure 150. The barrier layer 160 is arranged on a surface of the second inorganic encapsulation layer 43 of the encapsulation structure 40 away from the base substrate 10, and an orthographic projection of the barrier layer 160 on the base substrate 10 covers the orthographic projection of the second inorganic encapsulation layer 43 on the base substrate 10. For example, the barrier layer 160 may comprise a polymer material. It should be understood that due to the height difference of the encapsulation structure 40, the barrier layer 160 arranged on the encapsulation structure 40 may also extend from a position higher than the display light-emitting element 300 to a position lower than the display light-emitting element 300.

As shown in FIG. 5, the first touch layer 151 is arranged on a surface of the barrier layer 160 away from the base substrate 10, the touch insulating layer 153 is arranged on a side of the first touch layer 151 away from the base substrate 10, the second touch layer 152 is arranged on a side of the touch insulating layer 153 away from the base substrate 10, and the touch cover layer 154 is arranged on a side of the second touch layer 152 away from the base substrate 10. An orthographic projection of the touch insulating layer 153 on the base substrate 10 covers an orthographic projection of the first touch layer 151 on the base substrate 10. For example, the touch insulating layer 153 may be a single-layer or multi-layer structure comprising silicon oxide or silicon nitride. The touch cover layer 154 covers both the first touch layer 151 and the second touch layer 152 so as to protect the touch wires.

If the touch wires are directly formed on the inorganic encapsulation layer of the encapsulation structure, a bonding force between the touch wires and the inorganic encapsulation layer is poor, and there is a risk of the touch wires falling off the inorganic encapsulation layer. By providing the barrier layer 160 between the encapsulation structure 40 and the touch structure 150, the touch wires are formed on the barrier layer 160, which increases the bonding force between the encapsulation structure 40 and the touch structure 150, thereby reducing the risk of the touch wires falling off the inorganic encapsulation layer.

Continuing to refer to FIG. 5, the first touch layer 151 includes a first touch structure close to the opening 70, and the first touch structure forms the light-shielding structure 50. For example, the first touch layer 151 includes a plurality of first touch wires 91 arranged in a same layer, and the first touch structure is one of the plurality of first touch wires 91 close to the opening 70. It should be noted that the first touch wire close to the opening 70 may transmit a touch signal, that is, the first touch wire close to the opening 70 is used to transmit the touch signal and also to shield light.

In some embodiments, the first touch structure may be a first dummy touch wire arranged in a same layer as the plurality of first touch wires 91 and arranged close to the opening 70. In other words, the first touch wire close to the opening 70 may be a first dummy touch wire, that is, no actual touch signal is transmitted thereon. In this case, the first dummy touch wire close to the opening 70 is arranged in a same layer as the first touch wires 91 for transmitting the touch signal, so as to shield light.

That is, the light-shielding structure 50 includes a first touch wire arranged close to the opening 70 or a first dummy touch wire arranged in a same layer as the first touch wires 91. As shown in FIG. 5, the first touch wire 91 or the first dummy touch wire used as the light-shielding structure 50 has a width greater than that of a second touch wire 92. That is, the width of the first touch wire 91 used as the light-shielding structure 50 is set large enough so that the first touch wire 91 extends from a position higher than the display light-emitting element 300 to a position lower than the display light-emitting element 300.

As shown in FIG. 5, the first touch wire 91 for shielding light includes a first portion 911 and a second portion 912 that extend continuously. An orthographic projection of the first portion 911 of the first touch wire 91 on the base substrate 10 overlaps the orthographic projection of the organic encapsulation layer 42 on the base substrate 10. An orthographic projection of the second portion 912 of the first touch wire 91 on the base substrate 10 does not overlap the orthographic projection of the organic encapsulation layer 42 on the base substrate 10, but falls within the orthographic projection of each of the first inorganic encapsulation layer 41 and the second inorganic encapsulation layer 43 on the base substrate. In this way, the first portion 911 of the first touch wire 91 is located higher than the display light-emitting element 300, and the second portion 912 of the first touch wire 91 is located lower than the display light-emitting element 300. As shown in FIG. 5, a light-emitting layer 322 of the display light-emitting element 300 includes a first surface (that is, a lower surface shown) close to the base substrate 10 and a second surface (that is, an upper surface shown) away from the base substrate 10. A height position of the first surface of the light-emitting layer 322 is indicated by a dotted line HL, and a height position of the second surface of the light-emitting layer 322 is indicated by a dotted line HH. The base substrate 10 includes a first surface (hereinafter also referred to as "an upper surface") close to the display light-emitting element 300 and the light-shielding structure 50. For example, a portion of the light-shielding structure 50 is located higher than the dotted line HH, and the other portion of the light-shielding structure 50 is located lower than the dotted line HH.

In some embodiments, a vertical distance between the first portion 911 of the first touch wire 91 and the upper surface of the base substrate 10 is greater than a vertical distance between the organic light-emitting layer 322 of the display light-emitting element 300 and the upper surface of the base substrate 10, and a vertical distance between the second portion 912 of the first touch wire 91 and the upper surface of the base substrate 10 is less than the vertical distance between the organic light-emitting layer 322 of the display light-emitting element 300 and the upper surface of the base substrate 10. The vertical distance between the first portion 911 and the upper surface of the base substrate 10 may be determined by an average value of a plurality of vertical distances between the whole first portion 911 and the upper surface of the base substrate 10. For example, the average value may be indicated by a vertical distance H1 shown in FIG. 5. The vertical distance between the organic light-emitting layer 322 of the display light-emitting element 300 and the upper surface of the base substrate 10 may be determined by a vertical distance between the second surface HH of the organic light-emitting layer 322 of the display light-emitting element 300 and the upper surface of the base substrate 10, which is indicated, for example, by a vertical distance H2 shown in FIG. 5.

A vertical distance between the second portion 912 and the upper surface of the base substrate 10 is less than the vertical distance between the organic light-emitting layer 322 of the display light-emitting element 300 and the upper surface of the base substrate 10. The vertical distance between the second portion 912 and the upper surface of the base substrate 10 may be determined by an average value of a plurality of vertical distances between the whole second portion 912 and the upper surface of the base substrate 10. For example, the average value may be indicated by a vertical distance H3 shown in FIG. 5. The vertical distance between the organic light-emitting layer 322 of the display light-emitting element 300 and the upper surface of the base substrate 10 may be determined by the vertical distance H2 between the second surface HH of the organic light-emitting layer 322 of the display light-emitting element 300 and the upper surface of the base substrate 10.

For example, a vertical distance between at least a part of the second portion 912 and the upper surface of the base substrate 10 is less than a vertical distance between the first surface (that is, the lower surface) of the organic light-emitting layer 322 and the upper surface of the base substrate 10. The at least a part of the second portion 912 may include a part of the second portion 912 lower than the position HL, and the vertical distance between the at least a part of the second portion 912 and the upper surface of the base substrate 10 may be determined by an average value of a plurality of vertical distances between the part of the second portion 912 lower than the position HL and the upper surface of the base substrate 10. For example, the vertical distance between the first surface (that is, the lower surface) of the organic light-emitting layer 322 and the upper surface of the base substrate 10 may be indicated by a vertical distance H4 shown in FIG. 5.

In this embodiment, the first portion 911 of the first touch wire 91 close to the opening 70 forms the first light-shielding portion 51, and the second portion 912 of the first touch wire 91 close to the opening 70 forms the second light-shielding portion 52, that is, the first touch wire 91 close to the opening 70 may form the light-shielding structure 50. With such an arrangement, the light rays emitted from the organic light-emitting layer 322 and directed toward the opening 70 (for example, the light rays L1, L2, L3 in FIG. 5) may be all shielded by the first touch wire 91 and thus prevented from exiting from the opening 70. For example, the light rays L2 and L3 in FIG. 5 may be shielded by the second portion 912 lower than the organic light-emitting layer 322 and prevented from exiting from the opening 70. In this way, the light leakage at the edge of the opening may be reduced or even avoided. In addition, by setting the first touch wire 91 or the first dummy touch wire close to the opening 70 as the light-shielding structure 50, the light-shielding structure 50 and the first touch wire 91 may be formed by a same patterning process, so that a number of patterning processes may not be increased, and the manufacturing cost is saved. In addition, when the display substrate according to the embodiments of the present disclosure is provided in a cell with a cover substrate such as a color filter substrate, since the display substrate may completely prevent the light rays emitted by the light-emitting layer from propagating to the opening 70, there is no need to additionally provide black ink and other light-shielding elements on the cover substrate, which may simplify the manufacturing process of the cover substrate and reduce the manufacturing cost of the cover substrate. Furthermore, it is unnecessary to require a high bonding precision when cell-aligning the display substrate and the cover substrate, which is beneficial to the whole manufacturing processes.

As shown in FIG. 5, an orthographic projection of the isolation structure 60 on the base substrate 10 is located between the orthographic projection of the organic light-emitting layer 322 of the display light-emitting element 300 on the base substrate 10 and the orthographic projection of the opening 70 on the base substrate 10, and the orthographic projection of the light-shielding structure 50 on the base substrate 10 overlaps the orthographic projection of the isolation structure 60 on the base substrate 10. For example, the isolation structure 60 may include at least one isolation column and at least one dam structure. In the embodiment shown in FIG. 5, two isolation columns 61, 62 and two dam structures 63, 64 are exemplarily shown, and the orthographic projection of the second light-shielding portion 52 on the base substrate 10 at least partially overlaps an orthographic projection of the dam structures 63 and 64 on the base substrate 10. However, the embodiments of the present disclosure are not limited thereto, and the isolation structure 60 may include more isolation columns and more dam structures. In some embodiments, the orthographic projection of the second light-shielding portion 52 of the light-shielding structure 50 on the base substrate 10 at least partially overlaps the orthographic projection of the isolation structure 60 on the base substrate 10.

In some embodiments, the isolation columns and the dam structures may be made of photoresist, and may be obtained by a photolithography process. For another example, the isolation columns and the dam structures may be made of an inorganic material such as silicon nitride, silicon oxide, etc., and may be obtained by a dry etching process. In the practical manufacturing process, in order to save process, the isolation columns and the dam structures may be made by a same patterning process as other film layers. For example, the isolation columns and the dam structures may be formed by a single film layer, or may be formed by stacking a plurality of film layers. By providing the isolation columns and the dam structures, a path for water vapor and oxygen to enter the display light-emitting element is further extended, thereby improving an encapsulation reliability.

Figure 6:
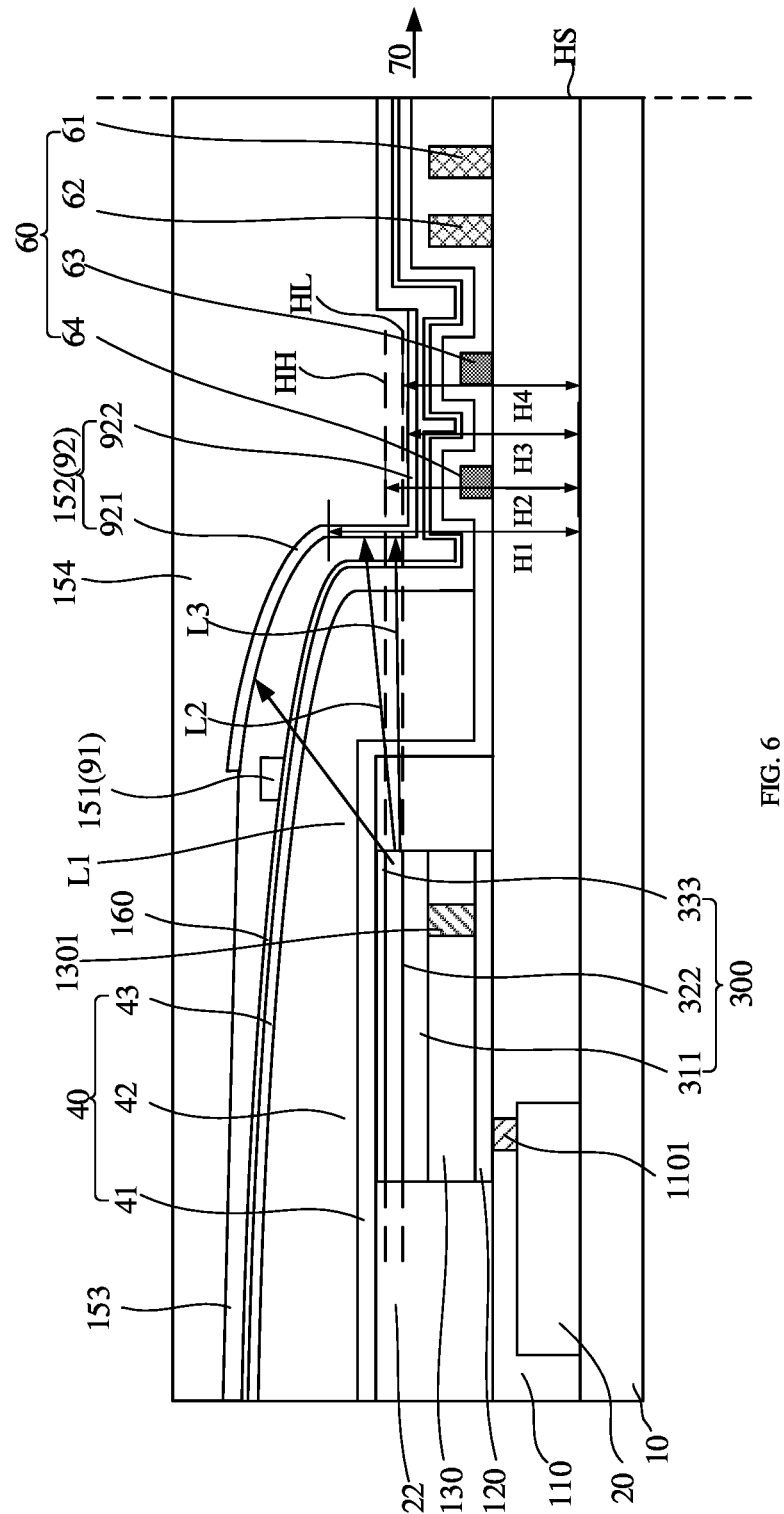
FIG. 6 shows a schematic cross-sectional view of the electroluminescent display substrate according to an exemplary embodiment of the present disclosure, taken along line B-B' in FIG. 4.

FIG. 6 shows a schematic cross-sectional view of the electroluminescent display substrate according to an exemplary embodiment of the present disclosure, taken along line B-B' in FIG. 4. The following mainly describes differences between the embodiment shown in FIG. 6 and the embodiment shown in FIG. 5. For other structures in the embodiment shown in FIG. 6, reference may be made to the above description of the embodiment shown in FIG. 5.

Referring to FIG. 6, the touch insulating layer 153 is arranged on a side of the barrier layer 160 away from the base substrate 10 and covers the first touch layer 151. Due to the height difference of the encapsulation structure 40, the touch insulating layer 153 arranged on the encapsulation structure 40 may also extend from a position higher than the display light-emitting element 300 to a position lower than the display light-emitting element 300.

Continuing to refer to FIG. 6, the second touch layer 152 includes a second touch structure close to the opening 70, and the second touch structure forms the light-shielding structure 50. For example, the second touch layer 152 includes a plurality of second touch wires 92 arranged in a same layer, and the second touch structure is one of the plurality of second touch wires 92 close to the opening 70. It should be noted that the second touch wire 92 close to the opening 70 may transmit a touch signal, that is, the second touch wire 92 close to the opening 70 is used to transmit the touch signal and also to shield light.

In some embodiments, the second touch structure may be a second dummy touch wire arranged in a same layer as the plurality of second touch wires 92 and arranged close to the opening 70. In other words, the second touch wire 92 close to the opening 70 may be a second dummy touch wire, that is, no actual touch signal is transmitted thereon. In this case, the second dummy touch wire close to the opening 70 is arranged in a same layer as the second touch wires 92 for transmitting the touch signal, so as to shield light.

That is, the light-shielding structure 50 includes a second touch wire 92 arranged close to the opening 70 or a second dummy touch wire arranged in a same layer as the second touch wire 92. As shown in FIG. 6, the second touch wire 92 or the second dummy touch wire used as the light-shielding structure 50 has a width greater than that of the first touch wire 91. That is, the width of the second touch wire 92 used as the light-shielding structure 50 is set large enough so that the second touch wire 92 extends from a position higher than the display light-emitting element 300 to a position lower than the display light-emitting element 300.

As shown in FIG. 6, the second touch wire 92 used as the light-shielding structure 50 includes a first portion 921 and a second portion 922 that extend continuously. An orthographic projection of the first portion 921 of the second touch wire 92 on the base substrate 10 overlaps the orthographic projection of the organic encapsulation layer 42 on the base substrate 10. An orthographic projection of the second portion 922 of the second touch wire 92 on the base substrate 10 does not overlap the orthographic projection of the organic encapsulation layer 42 on the base substrate 10, and falls within the orthographic projection of each of the first inorganic encapsulation layer 41 and the second inorganic encapsulation layer 43 on the base substrate. In this way, the first portion 921 of the second touch wire 92 is located higher than the display light-emitting element 300, and the second portion 922 of the second touch wire 92 is located lower than the display light-emitting element 300. As shown in FIG. 6, the light-emitting layer 322 of the display light-emitting element 300 includes a first surface (that is, a lower surface shown) close to the base substrate 10 and a second surface (that is, an upper surface shown) away from the base substrate 10. A height position of the first surface of the light-emitting layer 322 is indicated by a dotted line HL, and a height position of the second surface of the light-emitting layer 322 is indicated by a dotted line HH. The base substrate 10 includes a first surface (hereinafter also referred to as "an upper surface") close to the display light-emitting element 300 and the light-shielding structure 50. For example, a portion of the light-shielding structure 50 is located higher than the dotted line HH, and the other portion of the light-shielding structure 50 is located lower than the dotted line HH.

In some embodiments, a vertical distance between the first portion 921 of the second touch wire 92 and the upper surface of the base substrate 10 is greater than a vertical distance between the organic light-emitting layer 322 of the display light-emitting element 300 and the upper surface of the base substrate 10, and a vertical distance between the second portion 922 of the second touch wire 92 and the upper surface of the base substrate 10 is less than the vertical distance between the organic light-emitting layer 322 of the display light-emitting element 300 and the upper surface of the base substrate 10. The vertical distance between the first portion 921 and the upper surface of the base substrate 10 may be determined by an average value of a plurality of vertical distances between the whole first portion 921 and the upper surface of the base substrate 10. For example, the average value may be indicated by a vertical distance H1 shown in FIG. 6. The vertical distance between the organic light-emitting layer 322 of the display light-emitting element 300 and the upper surface of the base substrate 10 may be determined by a vertical distance between the second surface HH of the organic light-emitting layer 322 of the display light-emitting element 300 and the upper surface of the base substrate 10, which is indicated, for example, by a vertical distance H2 shown in FIG. 6.

A vertical distance between the second portion 922 and the upper surface of the base substrate 10 is less than the vertical distance between the organic light-emitting layer 322 of the display light-emitting element 300 and the upper surface of the base substrate 10. The vertical distance between the second portion 922 and the upper surface of the base substrate 10 may be determined by an average value of a plurality of vertical distances between the whole second portion 922 and the upper surface of the base substrate 10. For example, the average value may be indicated by a vertical distance H3 shown in FIG. 6. The vertical distance between the organic light-emitting layer 322 of the display light-emitting element 300 and the upper surface of the base substrate 10 may be determined by the vertical distance H2 between the second surface HH of the organic light-emitting layer 322 of the display light-emitting element 300 and the upper surface of the base substrate 10.

For example, a vertical distance between at least a part of the second portion 922 and the upper surface of the base substrate 10 is less than a vertical distance between the first surface (that is, the lower surface) of the organic light-emitting layer 322 and the upper surface of the base substrate 10. The at least a part of the second portion 922 may include a part of the second portion 922 lower than the position HL, and the vertical distance between the at least a part of the second portion 922 and the upper surface of the base substrate 10 may be determined by an average value of a plurality of vertical distances between the part of the second portion 922 lower than the position HL and the upper surface of the base substrate 10. For example, the vertical distance between the first surface (that is, the lower surface) of the organic light-emitting layer 322 and the upper surface of the base substrate 10 may be indicated by a vertical distance H4 shown in FIG. 6.

In this embodiment, the first portion 921 of the second touch wire 92 close to the opening 70 forms the first light-shielding portion 51, and the second portion 922 of the second touch wire 92 close to the opening 70 forms the second light-shielding portion 52, that is, the second touch wire 92 close to the opening 70 may form the light-shielding structure 50. With such an arrangement, the light rays emitted from the organic light-emitting layer 322 and directed toward the opening 70 (for example, the light rays L1, L2, L3 in FIG. 6) may be all shielded by the second touch wire close to the opening 70 and thus prevented from exiting from the opening 70. For example, the light rays L2 and L3 in FIG. 6 may be shielded by the second portion 922 lower than the organic light-emitting layer 322 and prevented from exiting from the opening 70. In this way, the light leakage at the edge of the opening may be reduced or even avoided. In addition, by setting the second touch wire or the second dummy touch wire close to the opening as the light-shielding structure, the light-shielding structure and the second touch wire may be formed by a same patterning process, so that a number of patterning processes may not be increased, and the manufacturing cost is saved.

Figure 7:
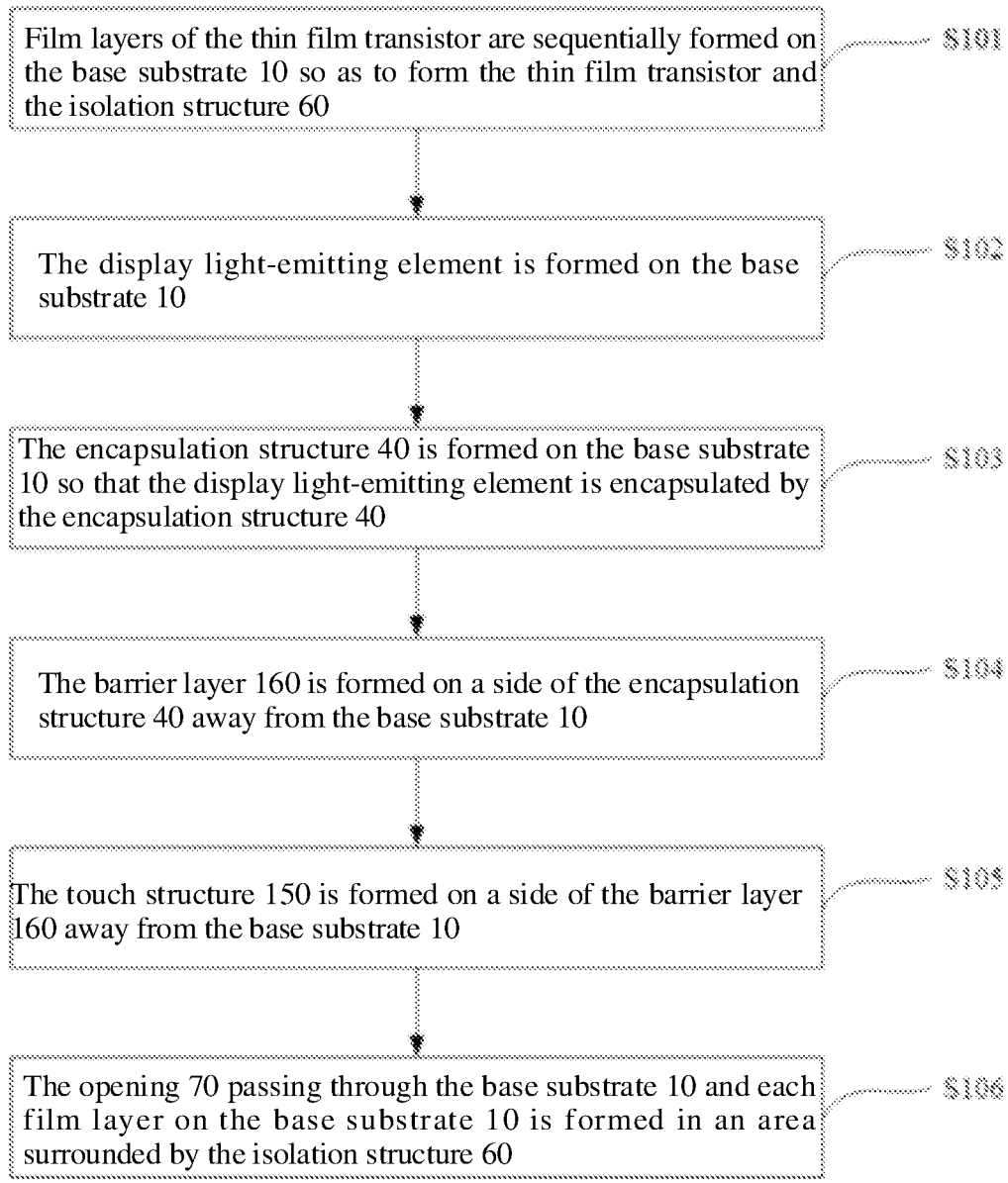
FIG. 7 shows a flowchart of a method of manufacturing an electroluminescent display substrate according to the embodiments of the present disclosure.

FIG. 7 shows a flowchart of a method of manufacturing an electroluminescent display substrate according to the embodiments of the present disclosure. Referring to FIG. 5 and FIG. 7, the method may be performed according to following steps. It should be noted that according to some embodiments of the present disclosure, some steps described above may be executed separately or in combination, and may be executed in parallel or sequentially, and are not limited to the specific operation sequence described below.

In step S101, film layers of the thin film transistor are sequentially formed on the base substrate 10 so as to form the thin film transistor 20, the first insulating layer 110, the conductive layer 120, the second insulating layer 130 and the isolation structure 60 shown in FIG. 5.

In step S102, the display light-emitting element is formed on the base substrate 10.

In step S103, the encapsulation structure 40 is formed on the base substrate 10 so that the display light-emitting element is encapsulated by the encapsulation structure 40.

In step S104, the barrier layer 160 is formed on a side of the encapsulation structure 40 away from the base substrate 10.

In step S105, the touch structure 150 is formed on a side of the barrier layer 160 away from the base substrate 10.

For example, as shown in FIG. 5, the first touch layer 151, the touch insulating layer 153, the second touch layer 152 and the touch cover layer 154 are sequentially formed on the surface of the barrier layer 160 away from the base substrate 10. The first touch layer 151 includes a plurality of first touch wires 91 arranged in a same layer. A first touch wire 91 in the plurality of first touch wires 91 close to the opening 70 is formed wide enough, so that the first touch wire 91 includes a first portion 911 and a second portion 912 that extend continuously. The first portion 911 of the first touch wire 91 is located higher than the display light-emitting element 300, and the second portion 912 of the first touch wire 91 is located lower than the display light-emitting element 300, so as to form the light-shielding structure 50.

In step S106, the opening 70 passing through the base substrate 10 and each film layer on the base substrate 10 is formed in an area surrounded by the isolation structure 60.

For example, portions of the film layers and the base substrate in the area surrounded by the isolation structure 60 may be removed by laser, stamping or other cutting methods, so as to form the opening 70.

In the manufacturing method described above, the encapsulation reliability of the display substrate may be improved without changing the existing process flow.

It should be noted that the embodiments described above are exemplary descriptions of the manufacturing method according to the embodiments of the present disclosure, and the execution process of each step or the sequence of the steps may be changed without departing from the technical concept of the present disclosure.

It should be understood that the manufacturing method provided by the embodiments of the present disclosure should have the same characteristics and advantages as the display substrate provided by the embodiments of the present disclosure. Therefore, the characteristics and advantages of the manufacturing method provided by the embodiments of the present disclosure may refer to those of the display substrate described above, which will not be repeated here.

Figure 8:
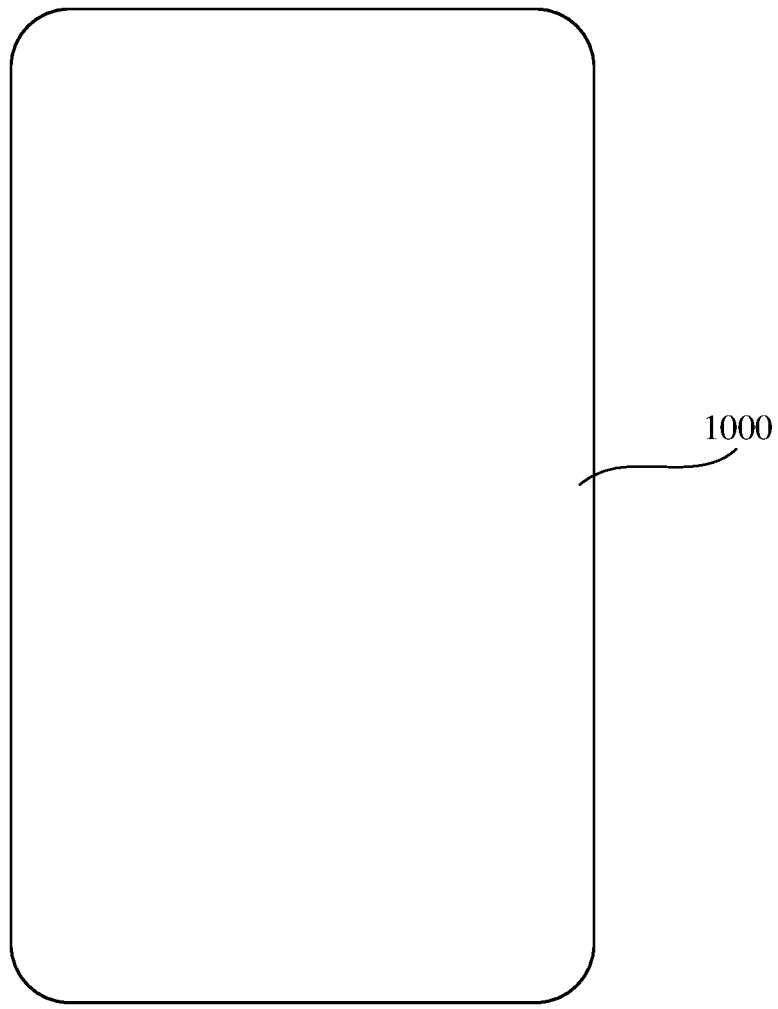
FIG. 8 shows a schematic diagram of a display device according to the embodiments of the present disclosure.

The embodiments of the present disclosure further provide a display device including the electroluminescent display substrate provided in the embodiments described above. FIG. 8 shows a plan view of a display device according to the embodiments of the present disclosure. The display device 1000 may include the display substrate described above, and it may be a display device with at least one opening. For example, the display device 1000 may be a smart phone, a wearable smart watch, smart glasses, a tablet computer, a television, a display, a notebook computer, a digital photo frame, a navigator, a vehicle display, an e-book, or any other product or component with a display function.

Although some embodiments according to the general concept of the present disclosure have been illustrated and described, it should be understood by those ordinary skilled in the art that these embodiments may be changed without departing from the principle and spirit of the general concept of the present disclosure. The scope of the present disclosure is defined by the claims and their equivalents.

What is claimed is:

1. An electroluminescent display substrate, comprising:
   a base substrate;
   a display light-emitting element arranged on the base substrate, wherein the display light-emitting element comprises a light-emitting layer for emitting light;
   an encapsulation structure arranged on the base substrate and covering the display light-emitting element;
   a light-shielding structure arranged on a side of the encapsulation structure away from the base substrate; and
   an opening at least passing through the encapsulation structure,
   wherein an orthographic projection of the light-shielding structure on the base substrate is located between an orthographic projection of the light-emitting layer of the display light-emitting element on the base substrate and an orthographic projection of the opening on the base substrate, and
   wherein the light-shielding structure comprises a first light-shielding portion and a second light-shielding portion that extend continuously, the base substrate comprises a first surface close to the display light-emitting element and the light-shielding structure, a vertical distance between the first light-shielding portion and the first surface of the base substrate is greater than a vertical distance between the light-emitting layer of the display light-emitting element and the first surface of the base substrate, and a vertical distance between at least a part of the second light-shielding portion and the first surface of the base substrate is less than the vertical distance between the light-emitting layer of the display light-emitting element and the first surface of the base substrate.

2. The electroluminescent display substrate of claim 1, wherein the light-emitting layer of the display light-emitting element comprises a first surface close to the base substrate, and the vertical distance between the at least a part of the second light-shielding portion and the first surface of the base substrate is less than a vertical distance between the first surface of the light-emitting layer and the first surface of the base substrate.

3. The electroluminescent display substrate of claim 1, further comprising a touch structure arranged on a side of the encapsulation structure away from the base substrate, wherein the touch structure comprises:
   a first touch layer arranged on a side of the encapsulation structure away from the base substrate, wherein the first touch layer comprises a first touch structure close to the opening, and the first touch structure forms the light-shielding structure; and
   a second touch layer arranged on a side of the first touch layer away from the base substrate.

4. The electroluminescent display substrate of claim 1, further comprising a touch structure arranged on a side of the encapsulation structure away from the base substrate, wherein the touch structure comprises:
   a first touch layer arranged on a side of the encapsulation structure away from the base substrate; and
   a second touch layer arranged on a side of the first touch layer away from the base substrate, wherein the second touch layer comprises a second touch structure close to the opening, and the second touch structure forms the light-shielding structure.

5. The electroluminescent display substrate of claim 3, wherein the first touch layer comprises a plurality of first touch wires arranged in a same layer, and the first touch structure is one of the plurality of first touch wires that is close to the opening.

6. The electroluminescent display substrate of claim 5, wherein the second touch layer comprises a plurality of second touch wires arranged in a same layer, and the first touch structure has a width greater than a width of each of the plurality of the second touch wires.

7. The electroluminescent display substrate of claim 3, wherein the first touch layer comprises a plurality of first touch wires arranged in a same layer, and the first touch structure is a first dummy touch wire arranged in a same layer as the plurality of first touch wires and arranged close to the opening.

8. The electroluminescent display substrate of claim 7, wherein the second touch layer comprises a plurality of second touch wires arranged in a same layer, and the first dummy touch wire has a width greater than a width of each of the plurality of second touch wires.

9. The electroluminescent display substrate of claim 4, wherein the second touch layer comprises a plurality of second touch wires arranged in a same layer, and the second touch structure is one of the plurality of second touch wires that is close to the opening.

10. The electroluminescent display substrate of claim 9, wherein the first touch layer comprises a plurality of first touch wires arranged in a same layer, and the second touch structure has a width greater than a width of each of the plurality of first touch wires.

11. The electroluminescent display substrate of claim 4, wherein the second touch layer comprises a plurality of second touch wires arranged in a same layer, and the second touch structure is a second dummy touch wire arranged in a same layer as the plurality of second touch wires and arranged close to the opening.

12. The electroluminescent display substrate of claim 11, wherein the first touch layer comprises a plurality of first touch wires arranged in a same layer, and the second dummy touch wire has a width greater than a width of each of the plurality of first touch wires.

13. The electroluminescent display substrate of claim 5, wherein the touch structure further comprises a touch insulating layer arranged on a side of the first touch layer away from the base substrate, and the touch insulating layer covers the first touch structure.

14. The electroluminescent display substrate of claim 4, wherein the touch structure further comprises a touch cover layer arranged on a side of the second touch layer away from the base substrate, and the touch cover layer covers the second touch structure.

15. The electroluminescent display substrate of claim 1, wherein the encapsulation structure comprises:
 a first inorganic encapsulation layer arranged on a side of the display light-emitting element away from the base substrate;
 an organic encapsulation layer arranged on a side of the first inorganic encapsulation layer away from the base substrate; and
 a second inorganic encapsulation layer arranged on a side of the organic encapsulation layer away from the base substrate,
 wherein an orthographic projection of the organic encapsulation layer on the base substrate has an area less than an area of an orthographic projection of each of the first inorganic encapsulation layer and the second inorganic encapsulation layer on the base substrate, and
 wherein an orthographic projection of the first light-shielding portion on the base substrate overlaps the orthographic projection of the organic encapsulation layer on the base substrate, and an orthographic projection of the second light-shielding portion on the base substrate does not overlap the orthographic projection of the organic encapsulation layer on the base substrate.

16. The electroluminescent display substrate of claim 15, further comprising: an isolation structure arranged on the base substrate, wherein an orthographic projection of the isolation structure on the base substrate is located between the orthographic projection of the light-emitting layer of the display light-emitting element on the base substrate and the orthographic projection of the opening on the base substrate, and wherein the orthographic projection of the light-shielding structure on the base substrate overlaps the orthographic projection of the isolation structure on the base substrate.

17. The electroluminescent display substrate of claim 16, wherein the orthographic projection of the second light-shielding portion on the base substrate at least partially overlaps the orthographic projection of the isolation structure on the base substrate.

18. The electroluminescent display substrate of claim 1, further comprising a barrier layer arranged between the encapsulation structure and the touch structure, wherein the light-shielding structure is located on a surface of the barrier layer away from the base substrate.

19. A display device comprising the electroluminescent display substrate of claim 1.

* * * * *